(12) United States Patent
Wang et al.

(10) Patent No.: US 8,693,894 B2
(45) Date of Patent: Apr. 8, 2014

(54) GAIN CLAMPED OPTICAL DEVICE FOR EMITTING LED MODE LIGHT

(75) Inventors: Shih-Yuan Wang, Palo Alto, CA (US); Michael Tan, Menlo Park, CA (US); Alexandre Bratkovski, Mountain View, CA (US); Sagi Mathai, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 802 days.

(21) Appl. No.: 12/259,985

(22) Filed: Oct. 28, 2008

(65) Prior Publication Data

US 2009/0268770 A1    Oct. 29, 2009

Related U.S. Application Data

(60) Provisional application No. 61/048,441, filed on Apr. 28, 2008.

(51) Int. Cl.
*G02B 6/26* (2006.01)
*H01S 5/00* (2006.01)
*H01S 3/03* (2006.01)
*H01S 3/08* (2006.01)

(52) U.S. Cl.
USPC .............. 398/201; 398/182; 385/14; 385/15; 385/115; 372/22; 372/20; 372/64; 372/50.11; 372/102

(58) Field of Classification Search
USPC ................................... 398/201, 182
See application file for complete search history.

(56) References Cited

U.S. PATENT DOCUMENTS

| | | | |
|---|---|---|---|
| 5,300,788 A | | 4/1994 | Fan et al. |
| 5,394,413 A | * | 2/1995 | Zayhowski ............... 372/10 |
| 5,420,880 A | * | 5/1995 | Tabatabaie et al. ...... 372/50.124 |
| 5,703,898 A | * | 12/1997 | Ogura ....................... 372/96 |
| 6,337,871 B1 | * | 1/2002 | Choa ....................... 372/45.01 |
| 6,455,340 B1 | | 9/2002 | Chua et al. |
| 7,173,758 B2 | | 2/2007 | Lee et al. |
| 2003/0194169 A1 | * | 10/2003 | Flory ....................... 385/15 |
| 2005/0063438 A1 | * | 3/2005 | Capasso et al. .......... 372/45 |
| 2005/0089292 A1 | * | 4/2005 | Kinoshita ............... 385/129 |
| 2005/0244860 A1 | * | 11/2005 | Schultz et al. .......... 435/6 |
| 2006/0083280 A1 | * | 4/2006 | Tauzin et al. ........... 372/46.01 |
| 2007/0071062 A1 | * | 3/2007 | Eisler et al. ............ 372/102 |

OTHER PUBLICATIONS

Fornari ["Semi Insulating Behavior of N-Type Lightly Fe-doped InP Wafers after Thermal Annealing"].*
Boudinov ["Electrical Isolation of N-Type and P-Type Layers by Proton Bombardment"].*

* cited by examiner

*Primary Examiner* — Oommen Jacob

(57) ABSTRACT

A gain clamped optical device includes a semiconductor stack and a resonant cavity configured to emit stimulated light. A window created in the optical device is configured to emit the stimulated light in an LED mode.

18 Claims, 7 Drawing Sheets

GAIN CLAMPED OPTICAL DEVICE FOR EMITTING LED MODE LIGHT

CROSS-REFERENCE TO RELATED APPLICATION

The present application claims priority from provisional application Ser. No. 61/048,441, filed Apr. 28, 2008, the contents of which are incorporated herein by reference in their entirety.

BACKGROUND

Light emitting diodes (LEDs) are semiconductor devices, which generally comprise a semiconductor stack having a p-n junction that is often referred to as the active region. The p-n junction of the semiconductor stack includes p-type and n-type semiconductor layers stacked together in close contact. LEDs are capable of emitting a relatively narrow-spectrum light when electrically biased in the forward direction of the p-n junction. The light generated by LEDs is emitted spontaneously upon the application of the electric voltage to the p-n junction, as opposed to the stimulated emission of lasers and laser diodes, which rely on stimulated light reflected within, and released from, a resonant cavity.

LEDs have been used as photonic interconnects to communicate data. In such applications, an LED is modulated by varying the intensity of the light produced by the LED and/or by turning the LED on and off to represent data as "0's" and "1's." However, conventional LEDs cannot be modulated at desired speeds, because the photon lifetime of the generated light is relatively long. Photon lifetime refers to a time constant that describes the decay (or the growth) of the number of photons, such as the amplitude of the light output. LEDs can be modulated at most to 1 GHz and lasers can be modulated to 40 GHz or more. Thus, the photon lifetime for LEDs is about 1 nanosecond versus tens of picoseconds for semiconductor lasers. Consequently, the utility of LEDs in the field of photonic interconnects is limited by the inability to achieve high speed modulation. In addition, increasing the modulation of an LED to 1 GHz greatly reduces its light output.

In contrast to LEDs, lasers have the ability to generate light with a shorter photon lifetime. Thus, lasers can be modulated at higher rates. For example, as described above, some lasers can be modulated to 40 GHz or more. Lasers, however, lack many of the beneficial attributes inherent to LEDs, such as reduced manufacturing costs, insensitivity to temperature variations, and insensitive to reflections. Reflections back into an LED will not de-stabilize its output, whereas in the case of a laser, reflections will cause instability in its light output. Attempts to reduce the photon lifetime of LEDs by introducing quantum wells into the active regions and doping have met with varying degrees of success. Current techniques still do not allow LEDs to be modulated at levels similar to that of a laser.

BRIEF DESCRIPTION OF THE DRAWINGS

Features of the present invention will become apparent to those skilled in the art from the following description with reference to the figures, in which.

DETAILED DESCRIPTION

Figure 1:
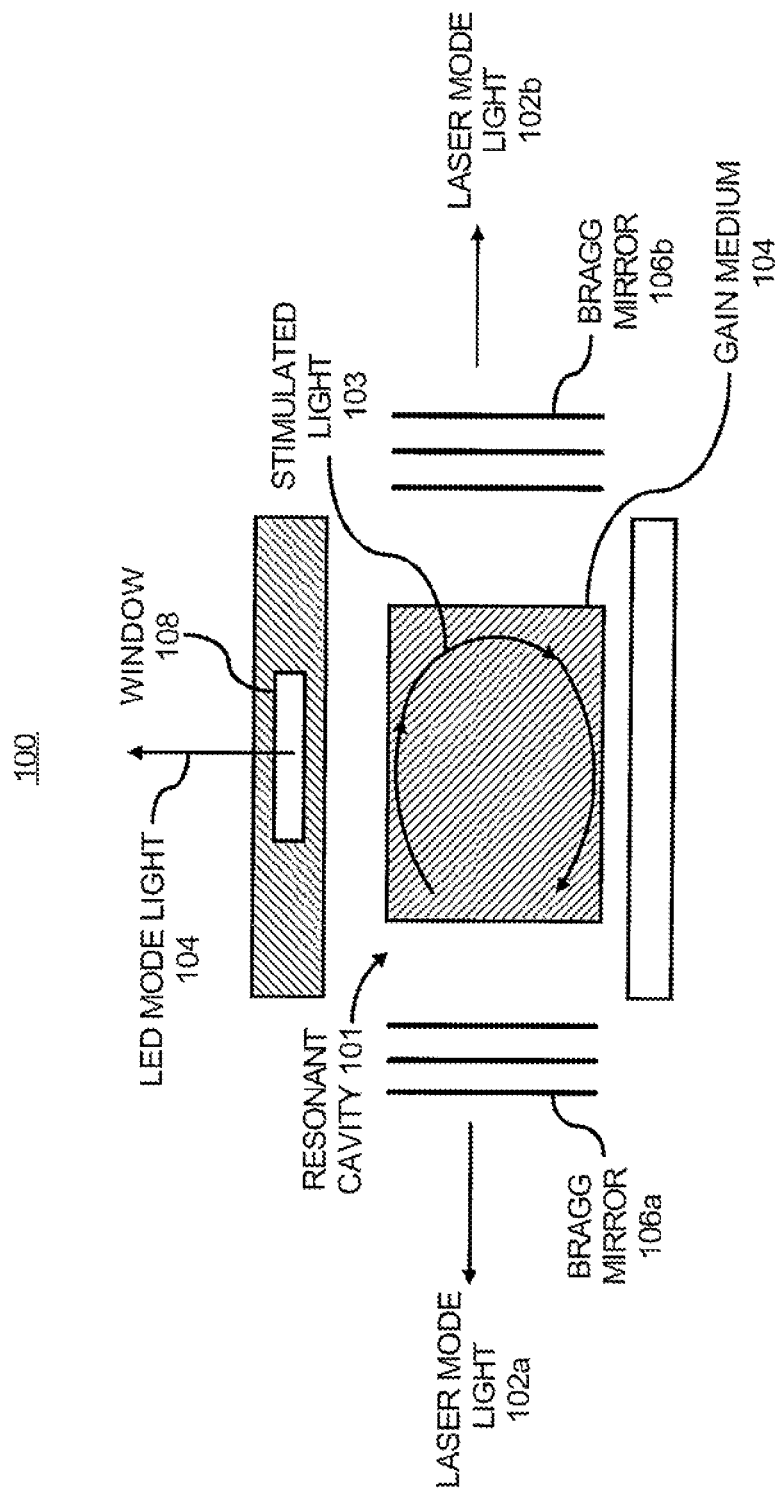
FIG. 1 shows a simplified representation of a gain clamped optical device, according to an embodiment of the invention.

For simplicity and illustrative purposes, the present invention is described by referring mainly to embodiment. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the description of the embodiments.

Disclosed herein are optical devices and methods for emitting light in a light emitting diode (LED) mode from an optical device. The optical device may include any semiconductor laser diode structure. For instance, the optical device may include a conventional semiconductor stack structure, such as a p-type semiconductor layer interfaced with an n-type semiconductor layer. When electrically biased in the forward direction, upon the application of a voltage, electrons and holes are injected into the p-n junction at the interface of the p-type and n-type semiconductor layers, and photons are released. Other suitable semiconductor stacks include a double heterostructure, which comprises multiple n-type and p-type layers and i-type layers. The semiconductor stack may also include additional layers, such as cladding layers and electrodes, as well as quantum wells and doping.

According to various embodiments, the semiconductor laser diodes of the optical devices may include a resonant cavity configured to provide feedback and a gain medium to stimulate light emission. That is, as in other types of lasers, the laser diodes may have a region in which photons are reflected one or more times as it traverse the gain medium to stimulate further emission of similar photons before being emitted from the laser diode as light. In the simplest form of laser diode, the resonant cavity may be an optical waveguide, which confines groups of photons organized into light waves to a relatively narrow planar region. The two ends of the waveguide are cleaved to form smooth, parallel edges, which are reflective to photons. The resulting resonant cavity is known as a Fabry-Perot resonator. Photons released into a mode of this resonant cavity will travel along the waveguide which include a gain region and be reflected several times from each end face before the photons increase in numbers and a small fraction of the photons pass through the reflective mirrors and out of the resonant cavity where the photons may be emitted as laser mode light.

This simplified form of resonant cavity with gain is described for purposes of example, and a person having ordinary skill in the art will appreciate that the resonant cavities of the optical devices described herein may have any reasonably suitable layers, shape, size, and configuration to amplify or stimulate photons. For example, the cleaved ends of a Fabry-Perot resonator, described above, may have a reflectivity of about 33%. However, in other embodiments, the resonant cavities may include distributed Bragg reflectors (DBRs), also known as Bragg mirrors, having a reflectivity of 99.0%, 99.9%, and higher. Moreover, the resonant cavities may include any reasonably suitable type of gain mediums to further stimulate the light reflected therein.

According to embodiments, the optical devices also include a window to release a portion of the light created in the optical devices in an LED mode instead of a laser mode. The primary mode of light released from a laser diode is the gain clamped laser mode light. The laser mode light is the mode of light that is intended to be created by a laser and is emitted through the reflective surfaces of the resonant cavity, as described above, generally in a first planar direction. Unlike the light produced by conventional LEDs, laser mode light is gain clamped, because the release of the laser mode light represents the point at which gain equals loss. Biasing beyond this threshold is called lasing, and any bias power input to the laser results in a laser output power in a more or less linear fashion. The window of the optical devices may release light in an LED mode in a second direction that is substantially perpendicular to the first planar direction of the laser mode light. LED's generally emit light through the p-type semiconductor material of the p-n junction for surface emitting LEDs. Therefore, unlike the laser mode light, the LED mode light emits from the optical device through the p-type or n-type semiconductor layer via the window that is perpendicular to the surface.

The window may be created by removing non-translucent or opaque portions of the optical device in a region perpendicular to the direction at which the laser mode light is emitted. For instance, portions of an electrode and/or cladding layer may be etched away using any lithographic process. The creation of the window, thus, allows a portion of the light created in the resonant cavity of the laser diode structure to be released through the window in an LED-like manner. The LED mode light coupled out of the resonant cavity through the window is "LED-like" in the sense that the light is not part of the light that is bouncing between the mirrors of the resonator. It is part of the optical loss that is light diffracting from the resonator and not part of the light that will be emitted In a lasing mode. That is, the optical device is still capable of creating laser node light as laser diodes are designed to do, but a portion of that gain clamped laser mode light is "harvested" to create the LED mode light. In an embodiment, only a relatively small fraction of the light created by the laser diode structure is coupled out of the resonant cavity so that the release of the LED mode light does not significantly disturb the laser performance. Moreover, the sensitivity to reflection of the LED mode light is greatly reduced. Sensitivity to reflection is light reflected back into the optical device, and the LED window does not destabilize the light output of the LED since the LED mode light is not a part of the resonator.

The methods and systems described herein allow for the improved modulation of LED mode light. Modulation speeds are increased because the LED mode light utilizes the shorter lifetime of the gain clamped stimulated light created by a laser diode. For example, the embodiments described herein may result in modulation speeds of LED mode light of 31 Gb/s, 5 Gb/s, 10 Gb/s, 20 Gb/s, 30 Gb/s, and higher. This allows an increased amount of data to be communicated in a given period of time, thereby resulting in a faster, more powerful photonic interconnect.

With particular reference now to FIG. 1, there is shown a simplified representation of a gain clamped optical device 100 for emitting LED mode light 104, according to an embodiment, where gain clamped is defined as operating the device at or above the lasing threshold where loss equals gain. Although particular reference has been made herein below to the gain clamped optical device 100 as including particular features, it should be understood that the gain clamped optical device 100 may include additional components and that some of the components described may be removed and/or modified without departing from a scope of the gain clamped optical device 100.

The gain clamped optical device 100 is illustrated as including a resonant cavity 101 with Bragg mirrors 106a and 106b on either side of the resonant cavity 101. Although not specifically illustrated in the simplified representation shown in FIG. 1, the resonant cavity 101 may include a semiconductor stack similar to conventional laser diodes that includes a least one gain region. For example, the resonant cavity 101 may include one or more p-type semiconductor layers and one or more n-type semiconductor layers. The resonant cavity 101 also includes a gain medium 104 comprised of gain material, quantum wells, doping, etc. Similarly, the optical device 100 may also include cladding layers and electrodes, which facilitate the application of a voltage to the optical device 100.

As holes and electrons of the semiconductor stack in the resonant cavity 101 combine the released photons may be reflected back and forth off of the Bragg mirrors 106a and 106b and through gain regions in the gain medium 104 to create amplified stimulated light 103. The Bragg mirrors 106a and 106b may be any type of DBR configured to reflect any amount of light. For instance, the Bragg mirrors 106a and 106b may have a reflectivity of 99.0%, 99.9%, and higher. In addition, the optical device 100 may include other Bragg mirrors (not shown) located in other planes of the resonant cavity 101. In other embodiments, however, the optical device 100 may not have Bragg mirrors 106a and 106b. Instead, other reflective devices or coatings, as well as the natural reflective surfaces of cleaved ends may be sufficient to create the stimulated light 103.

The amplified stimulated light 103 may be released from the optical device 100, through the Bragg mirrors 106a and 106b, as laser mode light 102a and 102b. The laser mode light 102a and 102b may be the standard form of light that the semiconductor stack of the resonant cavity 101 was designed to emit.

The optical device 100 includes a window 108, which allows light generated in the resonant cavity 101 to be released as LED mode light 104 normal to the surface and normal to the laser mode light emission. As set forth above, the window 108 may be created by etching away opaque portions of the gain clamped optical device 100. As FIG. 1 shows, the LED mode light 104 coupled out of the resonant cavity 101 is released in a direction, which is substantially perpendicular to the direction in which the laser mode light 102a and 102b is emitted. The window 108 may have any reasonably suitable size, shape, and configuration.

Figure 2:
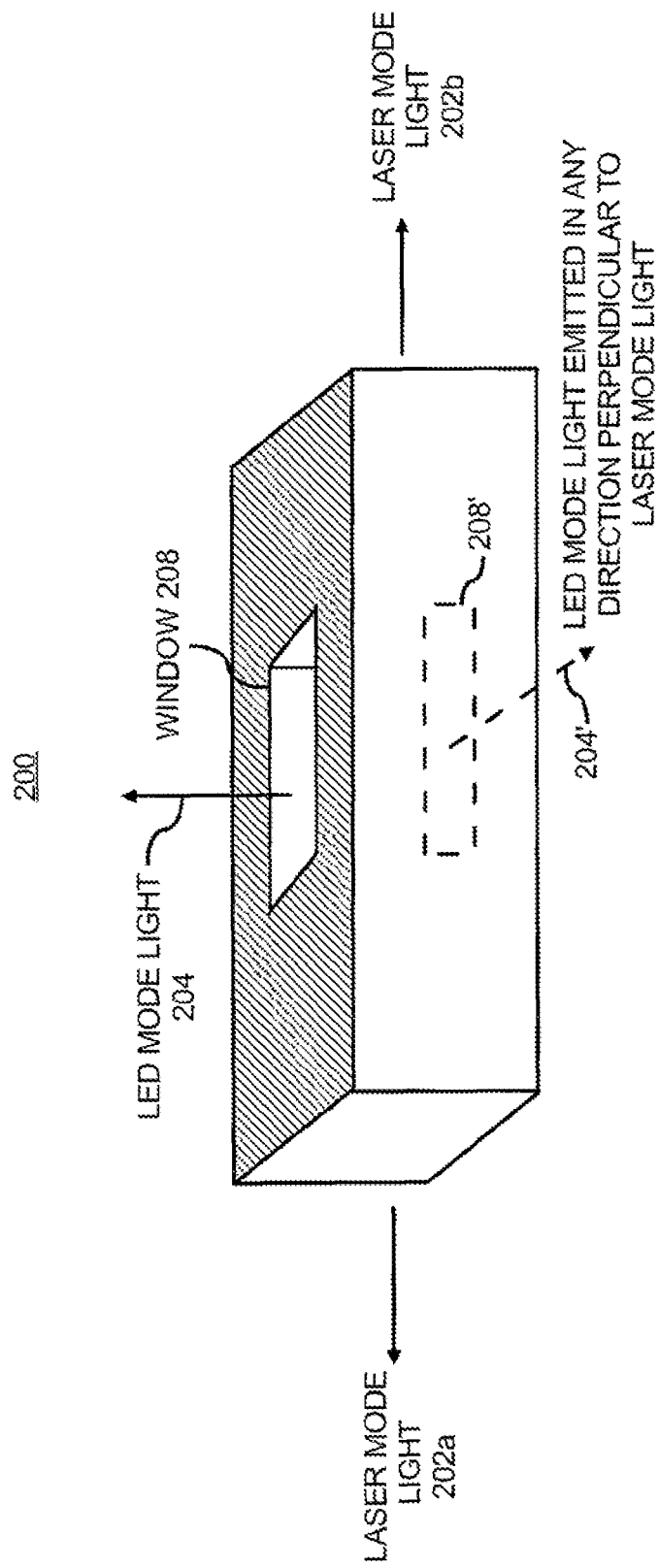
FIG. 2 shows a simplified view of a gain clamped optical device, according to an embodiment of the invention.

With particular reference now to FIG. 2, there is shown a simplified diagram of a gain clamped optical device 200 for emitting LED mode light 204, according to an embodiment. Although particular reference has been made herein below to the gain clamped optical device 200 as including particular features it should be understood that the gain clamped optical device 200 may include additional components and that some of the components described may be removed and/or modified without departing from a scope of the gain clamped optical device 200.

The gain clamped optical device 200 is illustrated as emitting both laser mode light 202a and 202b in a first direction and LED mode light 204 through a window 208 in a second direction. The gain clamped optical device 200 may be substantially similar to the representation of the gain clamped optical device 100, shown in FIG. 1. As such, the gain clamped optical device 200 may include a semiconductor gain stack and a resonant cavity to generate and amplify stimulated light. As FIG. 2 shows the first and second directions at which the laser mode light 202a and 202b and LED mode light 204, respectively, are emitted are substantially perpendicular to each other. In this manner, the gain clamped optical device 200 may be modulated such that both the laser mode light 202a and 202b and the LED mode light 204 are varied in intensity or turned on and off. Because the LED mode light 204 is coupled from stimulated light, the LED mode light 204 will have a shorter lifetime, as compared to the lifetime of non-stimulated light created by conventional LEDs. Therefore, the LED mode light may be modulated at speeds of about 3 Gb/s, 5 Gb/s, 10 Gb/s, 20 Gb/s, 30 Gb/s, and higher.

A dashed window 208' and dashed LED mode light 204' are shown to illustrate that the LED mode light can be emitted in any direction perpendicular to the emitted laser mode light 202a and 202b.

Figure 3:
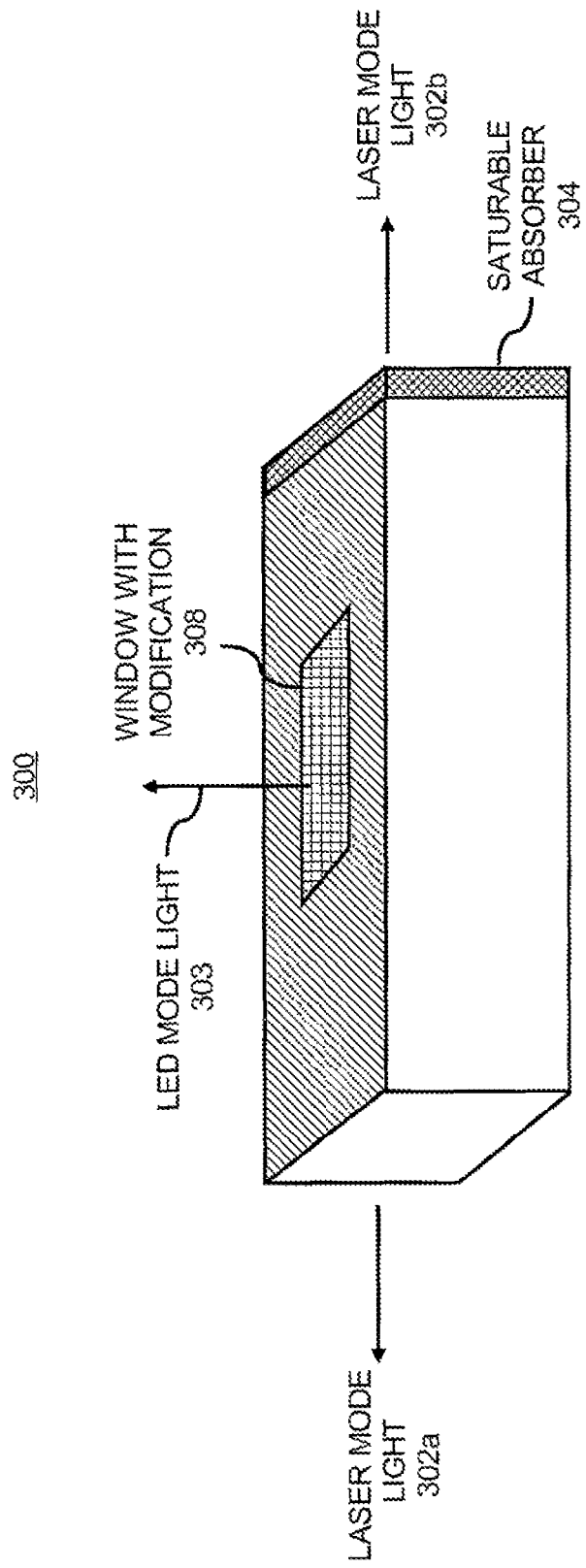
FIG. 3 shows a simplified view of a gain clamped optical device, according to another embodiment of the invention.

With particular reference now to FIG. 3, there is shown a simplified diagram of a gain clamped optical device 300 for emitting LED mode light 303, according to another embodiment. Although particular reference has been made herein below to the gain clamped optical device 300 as including particular features, it should be understood that the gain clamped optical device 300 may include additional components and that some of the components described may be removed and/or modified without departing from a scope of the gain clamped optical device 300.

The gain clamped optical device 300, shown in FIG. 3, may be similar to the gain clamped optical device 200, shown in FIG. 2, in that the gain clamped optical device 300 may emit laser mode light 302a and 302b in a first direction and LED mode light 303 in a second direction that is substantially perpendicular to the first direction. However, the gain clamped optical device 300 includes a window with a modification 308. The modification may comprise devices, coatings, filters, etc. configured to increase the efficiency and/or amount of the LED mode light 303 coupled through the window with modification 308 or a device used to alter the wavelength of the LED mode light 303 coupled through the window with modification 308. For example, the window with modification 308 may contain a grating, such as a second order grating. Alternatively, or in addition thereto, the window with modification 308 may have a roughened surface to increase the efficiency of LED mode light 303 extraction. In another embodiment, the window with modification 308 may contain an enhanced reflective coating configured for index or impedance matching between the semiconductor material and air.

The gain clamped optical device 300, depicted in FIG. 3, also includes a saturable absorber 304 or an optical component with a certain optical loss, which is reduced for high optical intensities. The saturable absorber 304 may comprise any material where the absorption of light decreases with increasing light intensity. The saturable absorber 304 may be used in quality factor (Q)-switching to quench the laser mode light 302a and 302b. By changing the Q of the resonant cavity of the gain clamped optical device 300, the loss is changed, and by increasing the loss, the threshold of the device is increased. When the loss is suddenly removed or reduced, the energy stored in the cavity is suddenly "dumped" resulting in a burst of output power from the laser. Therefore, as Q suddenly decreases, an increased amount of laser mode light 302a and 302b is released. In turn, the amount of LED mode light 303 is increased when the loss is high or Q is low, and LED output is decreased when the Q is high. In this manner, the saturable absorber 304 facilitates the modulation of the LED mode light 303. Although the gain clamped optical device 300 is shown with both a modified window 308 and a saturable absorber 304, a person having ordinary skill in the art will appreciate that the gain clamped optical device 300 may not simultaneously have both. In other embodiments, the optical device 300 may have only one of the window with modification 308 or the saturable absorber 304.

Figure 4:
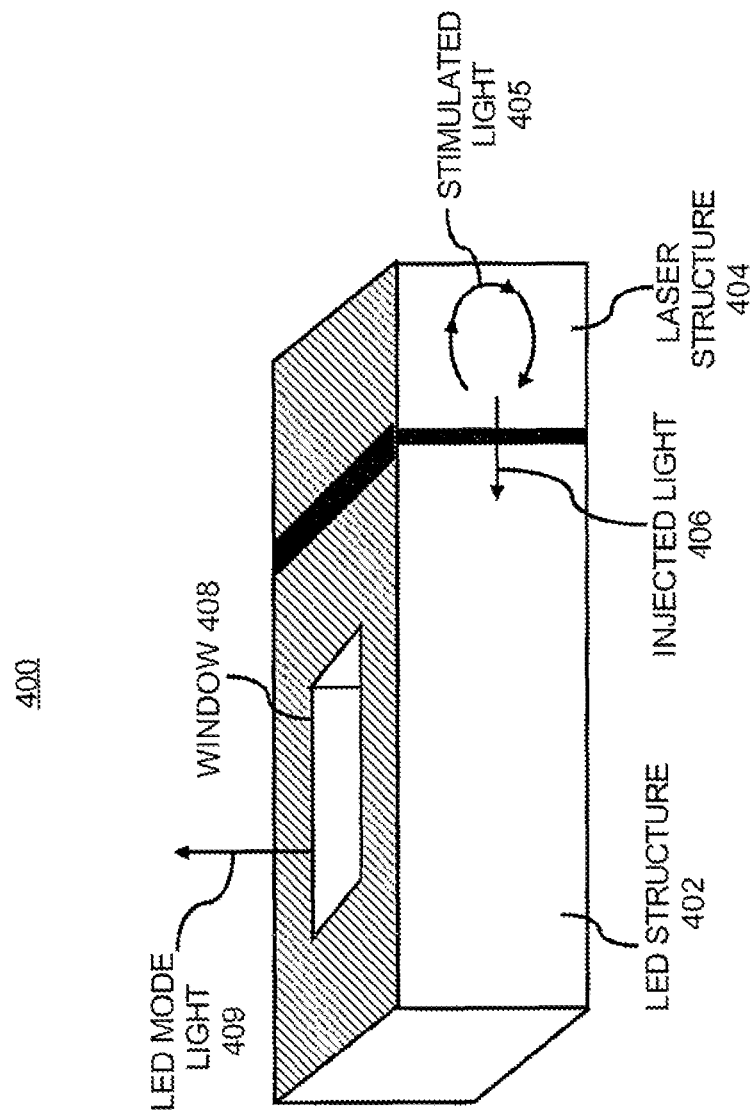
FIG. 4 shows a simplified view of an optical device, according to an embodiment of the invention.

With particular reference now to FIG. 4, there is shown a simplified diagram of an optical device 400 for emitting LED mode light 409, according to another embodiment. Although particular reference has been made herein below to the optical device 400 as including particular features, it should be understood that the optical device 400 may include additional components and that some of the components described may be removed and/or modified without departing from a scope of the optical device 400.

The optical device 400, shown in FIG. 4, includes an LED structure 402 and a laser structure 404 in combination. The LED structure 402 may comprise a semiconductor stack similar to those described above with respect to the laser diodes. For example, the semiconductor stack of the LED structure 402 may include one or more p-type semiconductor layers and one or more n-type semiconductor layers. Similarly, the laser structure 404 may comprise a laser diode also having a semiconductor stack, which may be substantially similar to the semiconductor stack of the LED structure 402. Moreover, one or more of the LED structure 402 and/or the laser structure 404 may contain a gain material. In fact, the LED structure 402 and the laser structure 404 may be fabricated monolithically from the same materials and divided after fabrication to separate the LED structure 402 and the laser structure 404. In one example, an etched facet is used to divide the LED structure 402 and the laser structure 404. Note that the laser structure 404 includes a resonant cavity in which stimulated light 405 is reflected and amplified as described with respect to FIG. 1.

The stimulated light 405 generated in the resonant cavity of the laser structure 404 may be emitted into the LED structure 402 as injected light 406. The injected light 406 is then emitted through a window 408 in the LED structure as LED mode light 409. The injected light is to reduce the lifetime of the photons in the LED structure so that the LED can be modulated at high frequency.]

As such, the LED structure 402 emits the LED mode light 409 in a direction that is substantially perpendicular to the direction at which the injected light 406 is emitted into the LED structure 402 by the laser structure 404. Utilizing the injected light 406 from the laser structure 404 reduces the lifetime of the LED mode light 409 emitted from the LED structure. Thus, LED mode light may be modulated at rates of about 3 Gb/s, 5 Gb/s, 10 Gb/s, 20 Gb/s, 30 Gb/s, and higher.

In an embodiment, the laser structure 404 may lase at a first wavelength. For example, the laser mode light produced by the laser structure 404 may have a wavelength of L1 or (L1)/n. The LED mode light 409 emitted through the window 408 may operate at a shifted wavelength, such as L2, which is different from the wavelength of the injected light 406 emitted from the laser structure 404. The wavelength of the light may be shifted by modifying the window 408 in a manner similar to the window with modification 308, described with respect to FIG. 3. For example, the window 408 may comprise a patterned surface grating (not shown). The period of the patterned surfaced grating may be changed to shift the light at different levels. For example, the LED mode light 409 may be shifted by a period of 10 nm.

Figure 5:
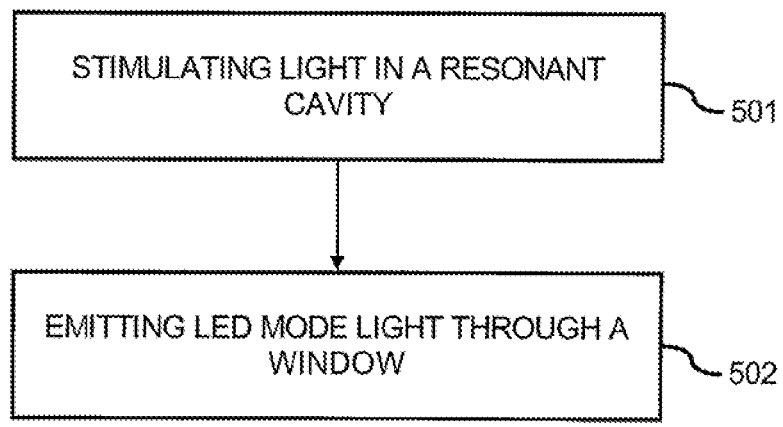
FIG. 5 shows a flow diagram of a method for emitting LED mode light from a gain clamped optical device, according to an embodiment of the invention.

Turning now to FIG. 5, there is shown a flow diagram of a method 500 for emitting LED mode light from a gain clamped optical device, according to an embodiment. It is to be understood that the following description of the method 500 is but one manner of a variety of different manners in which an example of the invention may be practiced. It should also be apparent to those of ordinary skill in the art that the method 500 represents a generalized illustration and that other steps may be added or existing steps may be removed, modified or rearranged without departing from a scope of the method 500.

The description of the method 500 is made with reference to the elements depicted in FIGS. 1-4, and thus makes reference to the elements cited therein. It should, however, be understood that the method 500 is not limited to the elements set forth in FIGS. 1-4. Instead, it should be understood that the method 500 may be practiced by a system having a different configuration than that set forth in FIGS. 1-4.

The method 500 may be initiated at step 501, where light is amplified and stimulated in a resonant cavity 101, as shown in FIG. 1. The resonant cavity 101 may include a semiconductor gain stack having Bragg mirrors 106a and 106b or other reflective surfaces configured to reflect and amplify light. The stimulated light 103 may be emitted as laser mode light 102a, 102b, 202a, 202b, 302a, 302b in a first direction.

At step 502, LED mode light is emitted through a window 108, 208, 308, 408 formed in the gain clamped optical device. The window 108, 208, 308, 408 may be formed by etching away opaque portions of an electrode and/or a cladding layer to allow a path for light to escape from the optical device. The window 108, 208, 308, 408 emits LED mode light in a second direction that is substantially perpendicular to the first direction.

Figure 6:
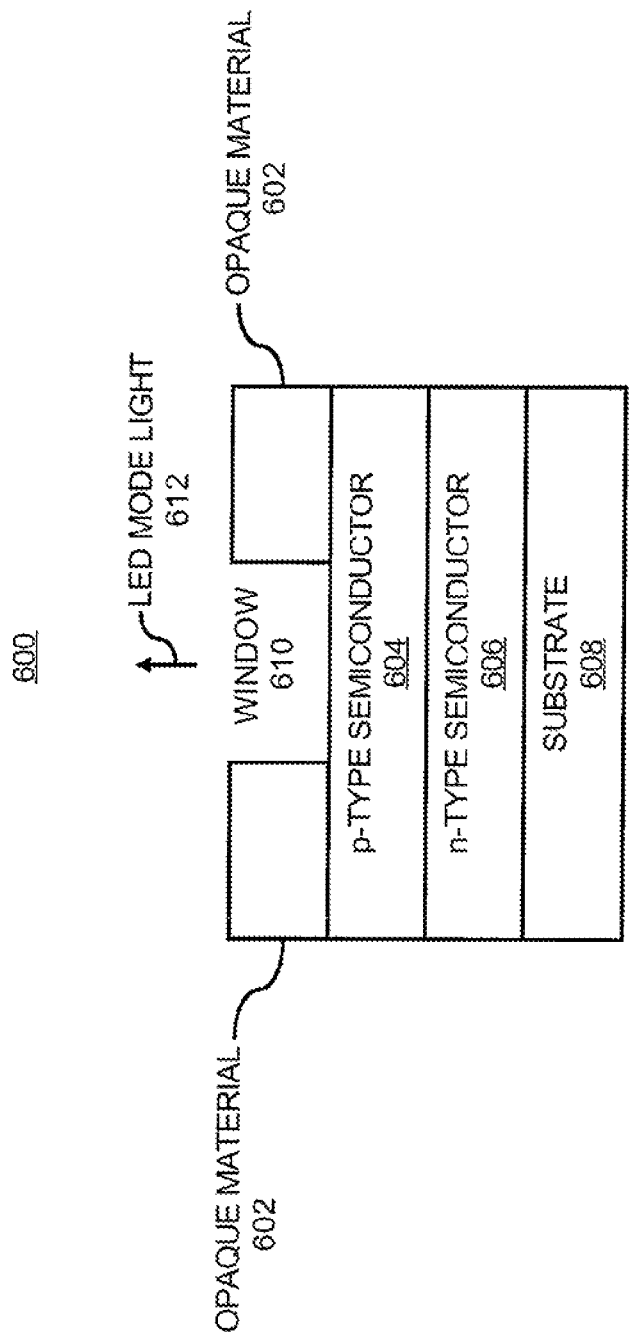
FIG. 6 shows a semiconductor stack, according to an embodiment of the invention.

With particular reference now to FIG. 6, there is shown a simplified diagram of a semiconductor stack 600, according to an embodiment. Although particular reference has been made herein below to the semiconductor stack 600 as including particular features, it should be understood that the semiconductor stack 600 may include additional components and that some of the components described may be removed and/or modified without departing from a scope of the semiconductor stack 600.

The semiconductor stack 600 may be included in one or more of the optical devices described above. The semiconductor stack 600 includes an n-type semiconductor material 606 formed on a substrate 608. A p-type semiconductor 604 is in contact with the n-type semiconductor 606 to create a p-n junction where electrons and holes may combine to release photons. An opaque material 602 is located in conjunction with the p-type semiconductor. The opaque material 602 may include any non-transparent materials, such as cladding layers and/or an electrode. As FIG. 6 shows, a window 610 is formed in the opaque material 602 to allow LED mode light 612 to be emitted through the p-type semiconductor 604. A person having ordinary skill in the art will appreciate that although single layers are shown in FIG. 6, each layer of the semiconductor stack 600 may include multiple layers.

Figure 7:
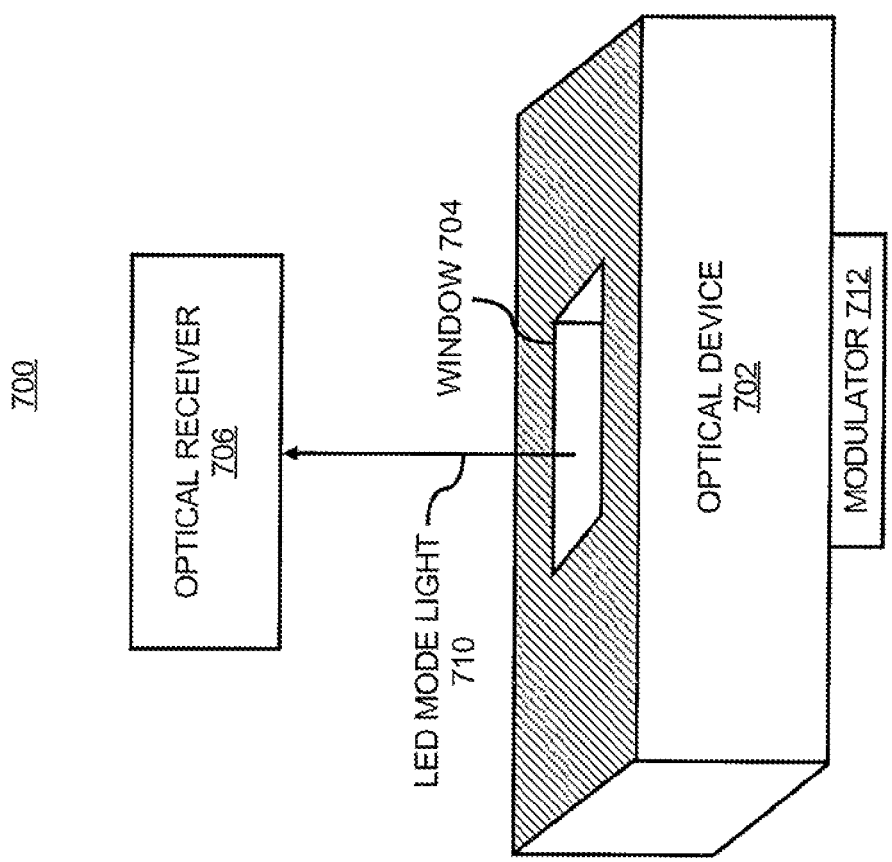
FIG. 7 shows an optical transmission system, according to an embodiment of the invention.

With particular reference now to FIG. 7, there is shown a simplified diagram of an optical transmission system 700, according to an embodiment. Although particular reference has been made herein below to the optical transmission system 700 as including particular features, it should be understood that the optical transmission system 700 may include additional components and that some of the components described may be removed and/or modified without departing from a scope of the optical transmission system 700.

The optical transmission system 700 includes an optical device 702, which may be substantially similar to one or more of the optical devices described above. The optical device 702 includes a window 704 for emitting LED mode light 710, which may be received by an optical receiver 706. Although not shown, the LED mode light 710 may be transmitted over a transmission medium or a waveguide such as an optical fiber. The optical device 702 also includes a modulator 712 for modulating the LED mode light 710 emitted from the device 702. The modulator 712 modulates the LED mode light to transmit digital data on fiber or other mediums.

The methods and systems described herein allow for the improved modulation of LED mode light. As set forth above, modulation speeds are increased because the LED mode light utilizes the shorter lifetime of the stimulated light created in a resonant cavity. The embodiments described herein may result in modulation speeds of LED mode light of 3 Gb/s, 5 Gb/s, 10 Gb/s, 20 Gb/s, 30 Gb/s, and higher. This allows an increased amount of data to be communicated in a given period of time, thereby resulting in a faster, more powerful photonic interconnect.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A gain clamped optical device comprising:
    a semiconductor stack;
    a resonant cavity configured to stimulate light, wherein the stimulated light is emitted from the resonant cavity in a lasing mode as laser mode light in a first direction; and
    a window configured to emit the stimulated light only in a light emitting diode (LED) mode in a second direction different from the first direction while the laser mode light is emitted in the first direction, wherein the LED mode light is light diffracting from the resonant cavity and the LED mode light is not in a lasing mode, and the LED mode light is modulated at or above about 3 Gb/s to communicate data to another optical device.

2. The gain clamped optical device of claim 1, wherein the window comprises a modification on the window and outside the resonant cavity to increase the amount of LED mode light emitted through the window.

3. The gain clamped optical device of claim 1, wherein the window comprises a modification configured to alter the wavelength of the LED mode light emitted through the window.

4. The gain clamped optical device of claim 1, wherein the resonant cavity comprises Bragg mirrors to reflect the stimulated light.

5. The gain clamped optical device of claim 1, further comprises a saturable absorber configured to change the Q of the resonant cavity.

6. The gain clamped optical device of claim 1, wherein the semiconductor stack includes a p-type semiconductor layer and an n-type semiconductor layer arranged together to form a p-n junction, wherein a surface of the p-type semiconductor layer contacts a surface of the n-type layer.

7. A gain-clamped optical device comprising:
    a laser structure configured to generate and emit stimulated light into an LED structure, wherein the laser structure comprises a resonant cavity; and
    the LED structure is in connection with the laser structure, wherein the LED structure comprises a window and, wherein the LED structure is configured to receive the stimulated light emitted from the laser structure that is diffracted and emit the diffracted light through the window in an LED mode while the laser structure emits light in a lasing mode, wherein the LED mode light is not in a lasing mode and there is insufficient feedback for light to be emitted through the window to reach lasing mode, and the LED mode light is modulated at or above about 3 Gb/s to communicate data to another optical device.

8. The optical device of claim 7, wherein the stimulated light is emitted into the LED structure in a first direction and the LED mode light is emitted through the window in a second direction and, wherein the first direction is substantially perpendicular to the second direction.

9. The optical device of claim 7, wherein the LED structure and the laser structure comprise a semiconductor stack including a p-type semiconductor layer and an n-type semiconductor layer arranged together to form a p-n junction, wherein a surface of the p-type semiconductor layer contacts a surface of the n-type layer.

10. The optical device of claim 7, wherein the window in the LED structure comprises a modification on the window and outside the resonant cavity to shift the wavelength of the LED mode light emitted through the window.

11. The optical device of claim 7, wherein the resonant cavity comprises at least one Bragg mirror to reflect the stimulated light.

12. A method of emitting LED mode light from a gain clamped optical device comprising:
  stimulating light in a resonant cavity;
  emitting the stimulated light as laser mode light from the resonant cavity in a lasing mode;
  emitting the stimulated light only as LED mode light through a window formed in the gain clamped optical device while the laser mode light is emitted from the resonant cavity in a lasing mode, wherein the LED mode light is light diffracting from the resonant cavity and is not in lasing mode; and
  modulating the LED mode light emitted from the window at or above about 3 Gb/s to communicate data to another device.

13. The method of claim 12, wherein the laser mode light is emitted in a first direction and the LED mode light is emitted in a second direction, wherein the first and second directions are substantially perpendicular to each other.

14. The method of claim 12, wherein stimulating the light in the resonant cavity comprises reflecting the light off of at least one Bragg mirror.

15. The method of claim 12, wherein the light stimulated in the resonant cavity has a first wavelength and, wherein emitting the LED mode light further comprises emitting the LED mode light at a second wavelength different from the first wavelength.

16. The method of claim 12, further comprising:
  modifying the window with the addition of at least one of a coating or a grating to increase the amount of LED mode light emitted through the window.

17. The method of claim 12, wherein stimulating the light comprises stimulating the light in a laser structure comprising a first semiconductor stack and the method further comprises:
  injecting the stimulated light into an LED structure comprising a second semiconductor stack.

18. The gain clamped optical device of claim 1, wherein there is insufficient feedback for light to reach lasing mode in the second direction.

* * * * *